(12) United States Patent
Park

(10) Patent No.: US 12,652,771 B2
(45) Date of Patent: Jun. 9, 2026

(54) DISPLAY DEVICE HAVING COVER WINDOW, DISPLAY PANEL, AND PROTECTIVE LAYER WITH PROTECTIVE FILMS AND METHOD OF MANUFACTURING THE SAME

(71) Applicant: SAMSUNG DISPLAY CO., LTD., Yongin-si (KR)

(72) Inventor: Hyunsang Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 219 days.

(21) Appl. No.: 18/229,558

(22) Filed: Aug. 2, 2023

(65) Prior Publication Data

US 2024/0224453 A1 Jul. 4, 2024

(30) Foreign Application Priority Data

Dec. 30, 2022 (KR) ........................ 10-2022-0191076

(51) Int. Cl.
*H05K 5/03* (2006.01)
*G09G 3/3233* (2016.01)
*H10K 59/80* (2023.01)

(52) U.S. Cl.
CPC ............. *H05K 5/03* (2013.01); *G09G 3/3233* (2013.01); *H10K 59/873* (2023.02); *G09G 2300/0842* (2013.01)

(58) Field of Classification Search
CPC ...... H05K 5/03; H10K 59/873; G09G 3/3233; G09G 2300/0842
See application file for complete search history.

(56) References Cited

U.S. PATENT DOCUMENTS

| | | | |
|---|---|---|---|
| 9,619,059 B2 | 4/2017 | Park et al. | |
| 11,528,812 B2 | 12/2022 | Ahn et al. | |
| 2017/0324060 A1* | 11/2017 | Kim ........................ | B32B 17/06 |
| 2020/0170126 A1* | 5/2020 | Ahn ....................... | G06F 1/1637 |
| 2020/0211437 A1* | 7/2020 | Ahn ....................... | G09G 3/3225 |
| 2020/0401185 A1* | 12/2020 | Won ..................... | B32B 38/0004 |
| 2021/0066640 A1* | 3/2021 | Shin ..................... | H10K 77/111 |
| 2021/0124399 A1* | 4/2021 | Jeong ..................... | G09F 9/301 |
| 2021/0384465 A1* | 12/2021 | Park ..................... | H10K 59/873 |

(Continued)

FOREIGN PATENT DOCUMENTS

| | | |
|---|---|---|
| CN | 111179777 | 2/2022 |
| KR | 1020200063379 A | 6/2020 |

(Continued)

*Primary Examiner* — Allen L Parker
*Assistant Examiner* — Peter Krim
(74) *Attorney, Agent, or Firm* — CANTOR COLBURN LLP

(57) ABSTRACT

A display apparatus includes: a cover window including a flat-surface area and a bent-surface area bent at a corner of the flat-surface area; a display panel arranged on a surface of the cover window and comprising a front display area and a corner area overlapping the flat-surface area and the bent-surface area, respectively; a first protective film, which is arranged on a surface of the display panel and overlapping the front display area; and a second protective film overlapping at least part of the corner area, where a tensile strength of the second protective film may be less than a tensile strength of the first protective film.

22 Claims, 12 Drawing Sheets

(56)     References Cited

U.S. PATENT DOCUMENTS

| | | | |
|---|---|---|---|
| 2021/0399076 A1* | 12/2021 | Lee | H10K 77/111 |
| 2022/0115621 A1* | 4/2022 | Wang | H10K 77/111 |
| 2022/0163831 A1* | 5/2022 | Noh | G02F 1/133305 |
| 2023/0080831 A1* | 3/2023 | Liao | G06F 1/1641 |
| | | | 257/91 |
| 2023/0180569 A1 | 6/2023 | Park et al. | |
| 2023/0247851 A1* | 8/2023 | Nakanishi | G06F 1/1637 |
| | | | 361/679.27 |
| 2023/0415456 A1* | 12/2023 | Akarapu | B32B 37/144 |

FOREIGN PATENT DOCUMENTS

| | | |
|---|---|---|
| KR | 1020210048633 A | 6/2021 |
| KR | 1020230083374 | 6/2023 |

* cited by examiner

DISPLAY DEVICE HAVING COVER WINDOW, DISPLAY PANEL, AND PROTECTIVE LAYER WITH PROTECTIVE FILMS AND METHOD OF MANUFACTURING THE SAME

This application claims priority to Korean Patent Application No. 10-2022-0191076, filed on Dec. 30, 2022, and all the benefits accruing therefrom under 35 U.S.C. § 119, the content of which in its entirety is herein incorporated by reference.

BACKGROUND

1. Field

One or more embodiments relate to a display apparatus, and more particularly, a display apparatus including a corner area.

2. Description of the Related Art

An electronic device based on mobility is being widely used. In addition to a small-sized electronic device, such as a mobile phone, and a tablet computer is being widely used as a mobile electronic device.

Such a mobile electronic device includes a display device to support various functions and provide visual information, such as image and videos, to users. In accordance with decrease in sizes of components for driving a display apparatus, the display apparatus tends to occupy greater portions in the electronic device, and the display device having a structure bendable to a certain degree in a flat state is being developed.

SUMMARY

One or more embodiments include a display device, in which the reliability of a corner area of a display panel may be improved.

Additional aspects will be set forth in part in the description which follows and, in part, will be apparent from the description, or may be learned by practice of the presented embodiments of the disclosure.

According to one or more embodiments, a display apparatus includes: a cover window including a flat-surface area and a bent-surface area bent at a corner of the flat-surface area; a display panel arranged on a surface of the cover window and comprising a front display area and a corner area overlapping the flat-surface area and the bent-surface area, respectively; a first protective film, which is arranged on a surface of the display panel and overlaps the front display area; and a second protective film overlapping at least part of the corner area, where a tensile strength of the second protective film may be less than a tensile strength of the first protective film.

In an embodiment, a tensile strength of the second protective film may be from about 10 gigapascals (GPa) to about 15 GPa.

In an embodiment, Young's Modulus of the first protective film may be about five hundred times to about two thousand times Young's Modulus of the second protective film.

In an embodiment, a recovery rate of the second protective film may be from about 94% to about 97%.

In an embodiment, the bent-surface area may include a first bent-surface area and a second bent-surface area arranged outside the first bent-surface area, and a light-blocking member overlapping the second bent-surface area may be further arranged under the cover window.

In an embodiment, the second protective film may correspond to the second bent-surface area.

In an embodiment, a thickness of the first bent-surface area may be identical to a thickness of the flat-surface area, and a thickness of the bent-surface area may decrease toward an edge of the second bent-surface area.

In an embodiment, a length of an outer edge of the second protective film before attachment to the cover window may be less than a length of an arc of the cover window at which the second protective film is attached.

In an embodiment, the first protective film may include a film-corner area corresponding to the corner area of the display panel, and a flat surface of the film-corner area may have a circular-sector shape.

In an embodiment, a flat surface of the second protective film may have a circular-sector shape.

According to one or more embodiments, a display apparatus includes: a cover window including a flat-surface area and a bent-surface area bent at a corner of the flat-surface area, the bent-surface area includes a first bent-surface area and a second bent-surface area; a light-blocking member arranged under the second bent-surface area; a display panel arranged on a surface of the cover window and including a front display area and a corner area overlapping the flat-surface area and the bent-surface area, respectively; a first protective film, which is arranged on a surface of the display panel and overlaps the front display area; and a second protective film overlapping at least part of the corner area, where the first protective film and the second protective film have different physical properties from each other.

In an embodiment, a tensile strength of the second protective film is less than a tensile strength, and the tensile strength of the second protective film may be from about 10 GPa to about 15 GPa.

In an embodiment, Young's Modulus of the first protective film may be about five hundred times to about two thousand times Young's Modulus of the second protective film.

In an embodiment, a recovery rate of the second protective film may be from about 94% to about 97%.

In an embodiment, the second protective film may overlap the light-blocking member.

In an embodiment, a length of an outer edge of the second protective film before attachment to the cover window may be less than a length of an arc of the cover window at which the second protective film is attached.

In an embodiment, the first protective film may include a film-corner area corresponding to the corner area of the display panel, and a flat surface of the film-corner area may have a circular-sector shape.

In an embodiment, a flat surface of the second protective film may have a circular-sector shape.

In an embodiment, a display element may be arranged in the display panel to correspond to the first bent-surface area.

In an embodiment, an adhesive layer may be further disposed between the cover window and the display panel.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
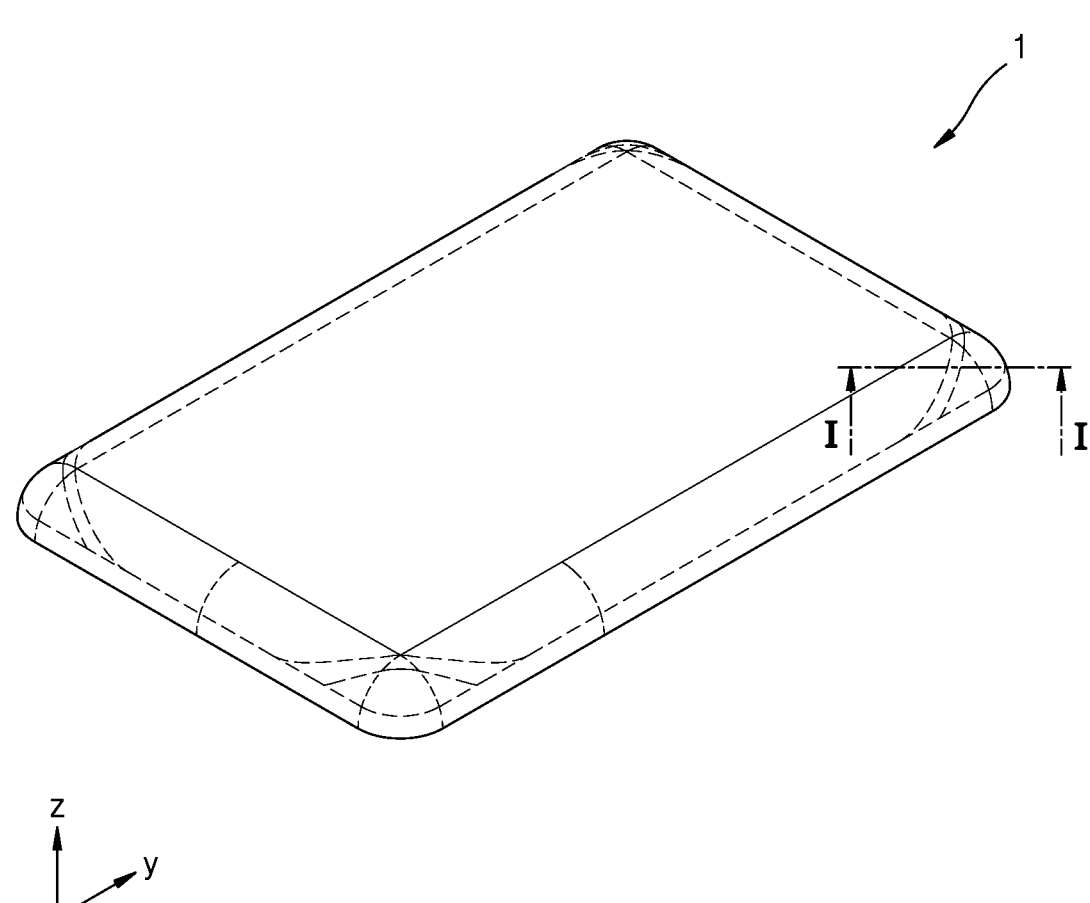
FIG. 1 is a perspective view schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the embodiments allow various modifications and may have various embodiments, particular embodiments thereof will be shown as examples in the drawings and will be described in detail in the following description. Advantageous effects and features of the embodiments and methods of achieving the same will be clearly understood with reference to embodiments described in detail in conjunction with the accompanying drawings. However, the embodiments are not limited to embodiments described hereinafter and may be embodied in various types.

Hereinafter, the embodiments will be described in detail with reference to the accompanying drawings, and in the descriptions with reference to the drawings, same reference numerals will be given to same or corresponding components, and descriptions thereof will not be repeatedly given.

In the following embodiments, terms such as "first," "second" are only used to distinguish one component from another, but not in a limited sense.

In the following embodiments, unless obviously defined otherwise, singular forms also include plural forms.

In the following embodiments, terms such as "include" or "comprise" indicate existence of features or components written in the specification, and does not preclude possibility of one or more additional features or components.

In the following embodiments, when a portion such as a film, an area, or a component is "on" or "above" another portion, the portion may be directly on the other portion, and other films, areas, or components may be located therebetween.

For convenience of explanation, sizes of components in the drawings may be exaggerated. For example, as sizes and thicknesses are arbitrarily shown for convenience of explanation, the embodiments are not limited to the accompanying drawings.

In the following embodiments, x axis, y axis, and z axis are not limited to three axes on an orthogonal coordinate system and may be interpreted as a broader sense. For example, x axis, y axis, and z axis may be orthogonal to one another, but may also refer to different directions not orthogonal to one another.

"About", "substantially identical" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. When a certain embodiment may be implemented differently, a specific process order may be performed differently from the described order. For example, two consecutively described processes may be performed substantially at the same time or performed in an order opposite to the described order.

FIG. 1 is a perspective view schematically illustrating a display apparatus 1 according to an embodiment.

Referring to FIG. 1, the display apparatus 1, which is an apparatus configured to display moving images or still images, may include portable electronic devices, such as mobile phones, smart phones, tablet personal computers, mobile communication terminals, electronic handbooks, electronic books, portable multimedia players, navigation devices, or ultra-mobile personal computers ("PC"). The display apparatus 1 may also include electronic devices, such as televisions, notebook computers, monitors, billboard charts, or Internet of Things ("IoT") devices. Alternatively, the display apparatus 1 may include a wearable device, such as smart watches, watch phones, and head mounted displays ("HMD"). Alternatively, the display apparatus 1 may include a portion of another device. In an embodiment, for example, the display apparatus 1 may include a display of an arbitrary electronic device. Alternatively, the display apparatus 1 may include a center information display ("CID") arranged on a dashboard or center fascia of a vehicle, may include a room mirror display substituting a side mirror of a vehicle, and may include a display arranged on a back surface of a front seat as entertainment for passengers in rear seats of a vehicle.

In an embodiment, the display apparatus 1 may have a square shape on a plane. As an alternative embodiment, the display apparatus 1 may have various shapes, such as a polygon like a triangle or a square, a circle, or an oval. In an embodiment, when the display apparatus 1 has a polygon shape on a plane, corners of the polygon may be rounded. Hereinafter, for convenience of explanation, a case in which the display apparatus 1 has a square shape with rounded corners on a plane will be mainly described.

The display apparatus 1 may have a short side in a first direction (e.g., an x direction or −x direction) and a long side in a second direction (e.g., a y direction or −y direction). In another embodiment, in the display apparatus 1, a length of a side in the first direction (e.g., the x direction or the −x direction) and a length of a side in the second direction (e.g., the y direction or the −y direction) may be identical to each other. In another embodiment, the display apparatus 1 may have a long side in the first direction (e.g., the x direction or the −x direction) and a short side in the second direction (e.g., the y direction or the −y direction). A corner, at which the short side in the first direction (e.g., the x direction or the −x direction) meets the long side in the second direction (e.g., the y direction or the −y direction), may be rounded to have a certain curvature.

Figure 2:
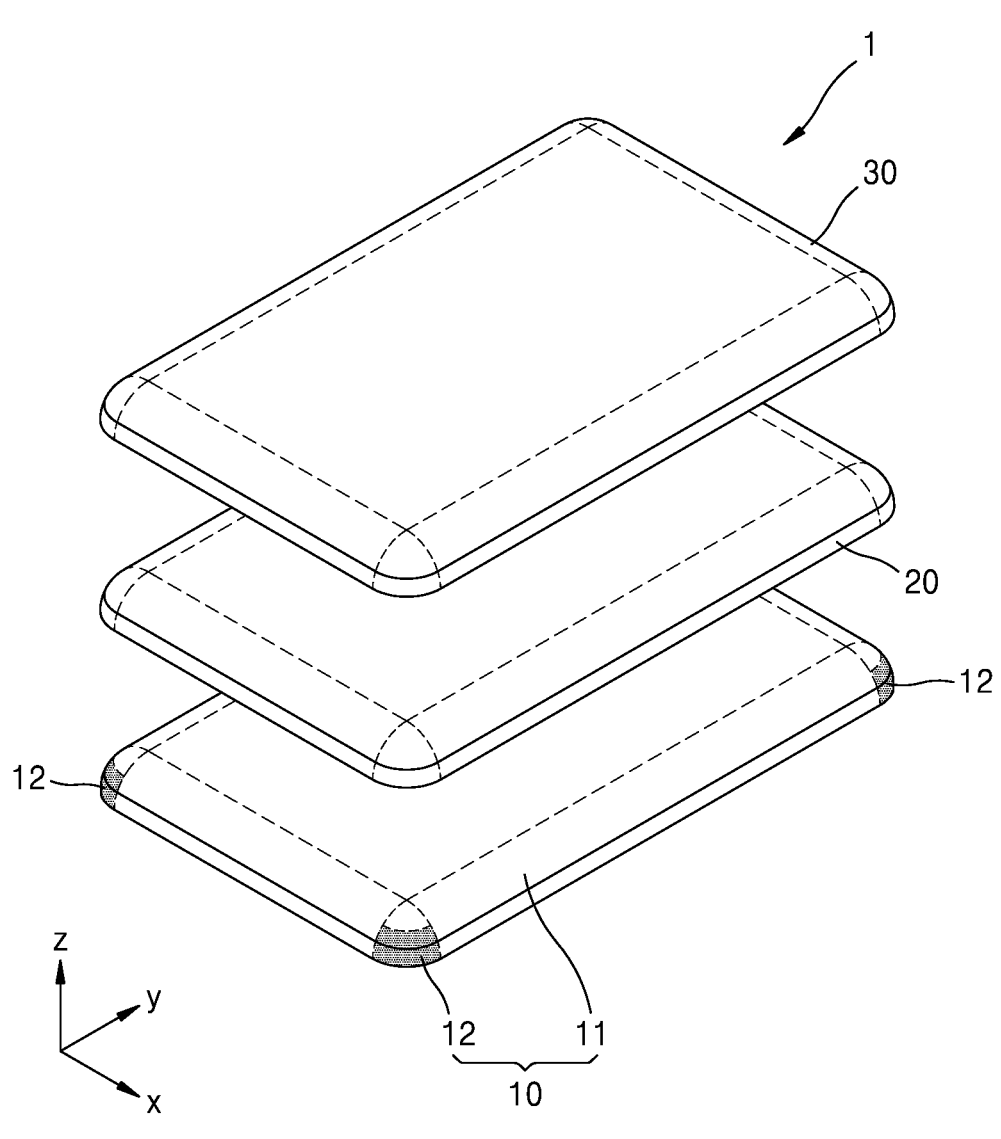
FIG. 2 is an exploded view schematically illustrating each of a protective film, a display panel, and a cover window of a display apparatus according to an embodiment.
Figure 3:
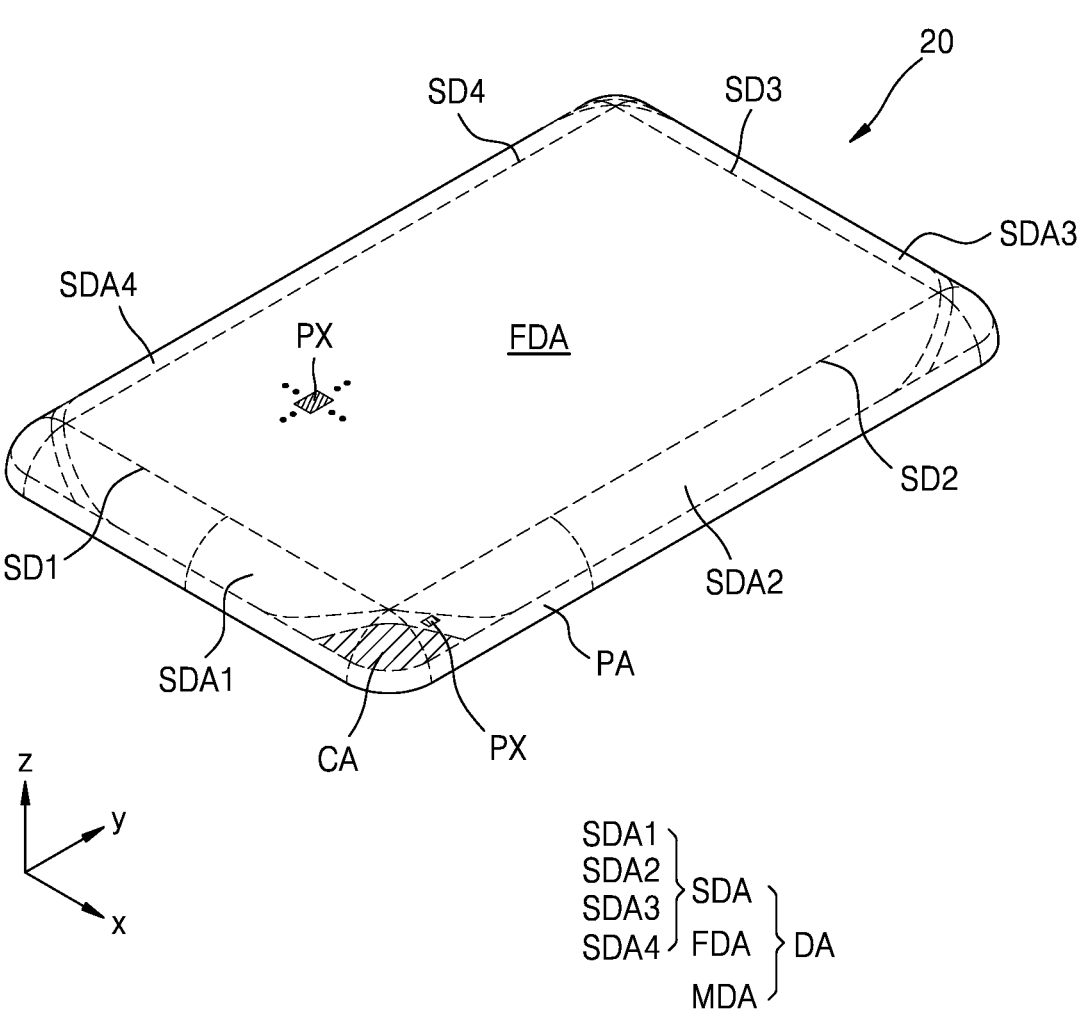
FIG. 3 is a perspective view schematically illustrating a display panel of a display apparatus according to an embodiment.
Figure 4:
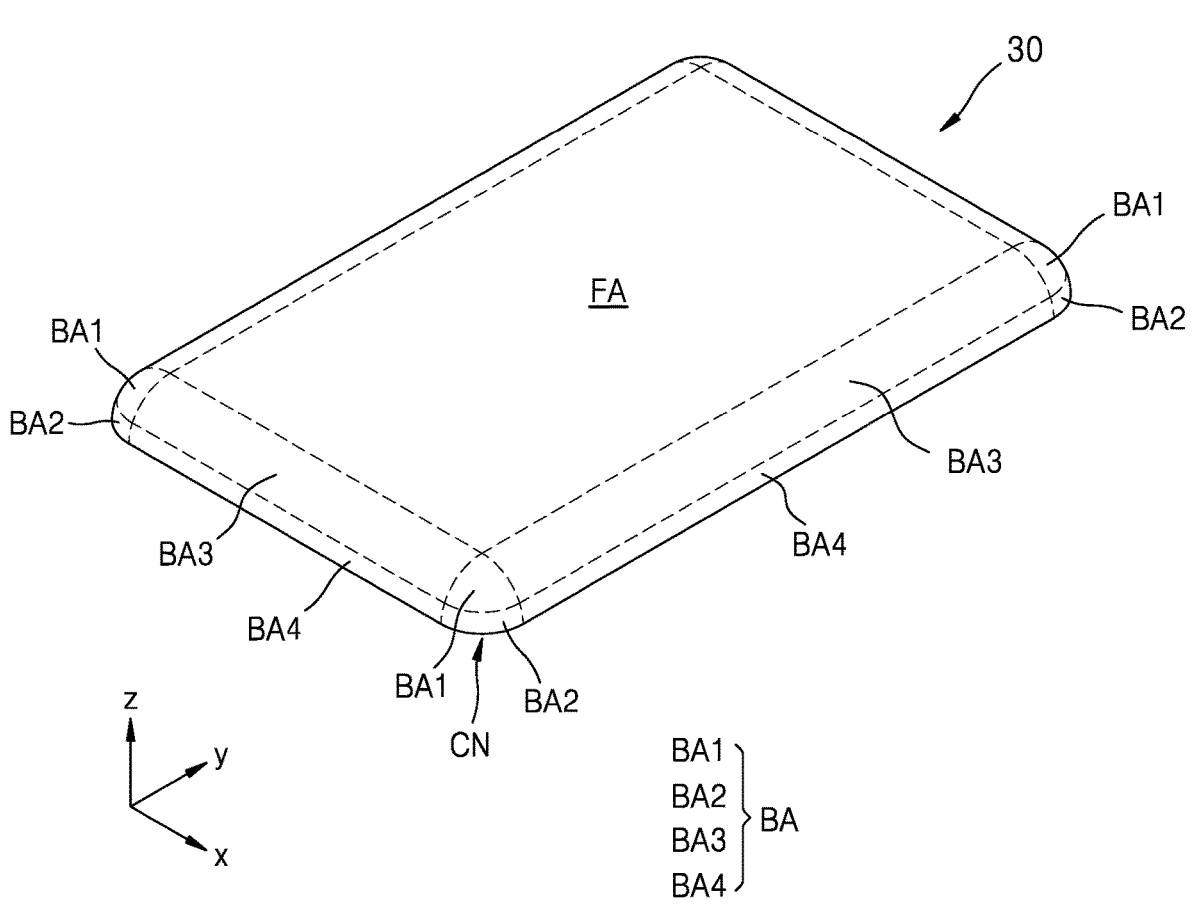
FIG. 4 is a perspective view schematically illustrating a cover window of a display apparatus according to an embodiment.

FIG. 2 is an exploded view illustrating each of a protective film 10, a display panel 20, and a cover window 30 of the display apparatus 1 according to an embodiment. FIG. 3 is a perspective view schematically illustrating the display panel 20 of the display apparatus 1 according to an embodiment. FIG. 4 is a perspective view of the cover window 30 of the display apparatus 1 according to an embodiment.

Referring to FIGS. 2 to 4, the display apparatus 1 may include the display panel 20, the cover window 30, and the protective film 10.

The display panel 20 may include a display area DA and a peripheral area PA outside the display area DA. A plurality of pixels PX may be arranged in the display area DA, and images may be provided by an array of the plurality of pixels PX. Each of the plurality of pixels PX may be defined as an area from which light is emitted by light-emitting devices provided in the display panel 20. In an embodiment, for example, each of the plurality of pixels PX may include a red subpixel, a green subpixel, and a blue subpixel. Alternatively, each of the plurality of pixels PX may include a red subpixel, a green subpixel, a blue subpixel, and a white subpixel.

According to an embodiment, the display area DA may include a front display area FDA, a side display area SDA, and a middle display area MDA. The plurality of pixels PX may be arranged in each of the front display area FDA, the side display area SDA, and the middle display area MDA. In an embodiment, the plurality of pixels PX in each of the front display area FDA, the side display area SDA, and the middle display area MDA may provide individual images.

The front display area FDA may include a flat surface. In an embodiment, the front display area FDA may occupy a greatest portion in the display area DA of the display panel 20, and therefore, may provide most of the images.

The side display area SDA, which is at least partially bent and includes curved surfaces, may extend outward from each edge of the front display area FDA. In an embodiment, the side display area SDA may include a first side display area SDA1, a second side display area SDA2, a third side display area SDA3, and a fourth side display area SDA4. In an embodiment, at least one of the first side display area SDA1, the second side display area SDA2, the third side display area SDA3, and the fourth side display area SDA4 may be omitted.

In an embodiment, the first side display area SDA1 may be adjacent to a first edge SD1 of the front display area FDA and may extend outward in the −y direction from the first edge SD1. The second side display area SDA2 may be adjacent to a second edge SD2 of the front display area FDA and may extend outward in the −x direction from the second edge SD2. The third side display area SDA3 may be adjacent to a third edge SD3 of the front display area FDA and may extend outward in the y direction from the third edge SD3. The fourth side display area SDA4 may be adjacent to a fourth edge SD4 of the front display area FDA and may extend outward in the −x direction from the fourth edge SD4. In this case, the first side display area SDA1 and the third side display area SDA3 may be opposite to each other with the front display area FDA between, and the second side display area SDA2 and the fourth side display area SDA4 may be opposite to each other with the front display area FDA between.

As shown in FIG. 3, the first side display area SDA1, the second side display area SDA2, the third side display area SDA3, and the fourth side display area SDA4 may each have a curved surface that is bent with a certain curvature. In an embodiment, for example, the first side display area SDA1 and the third side display area SDA3 may each have a curved surface that is bent with reference to a bending axis extending in the x direction, and the second side display area SDA2 and the fourth side display area SDA4 may each have a curved surface that is bent with reference to a bending axis extending in the y direction. Curvatures of the first side display area SDA1, the second side display area SDA2, the third side display area SD3, and the fourth side display area SDA4 may be identical to or different from one another. In an embodiment, for example, the curvature of the first side display area SDA1 and the curvature of the third side display area SDA3 may be identical to each other, and the curvature of the second side display area SDA2 and the curvature of the fourth side display area SDA4 may be identical to each other. In an embodiment, for example, the curvature of the first side display area SDA1 may be different from the curvature of the second side display area SDA2. As another example, the curvature of the first side display area SDA1 may be identical to the curvature of the second side display area SDA2.

The middle display area MDA may be arranged between the front display area FDA and a corner area CA to be described later. In addition, the middle display area MDA may be between the side display area SDA and the corner area CA. The middle display area MDA may extend between the front display area FDA and the corner area CA and between the side display area SDA and the corner area CA. When the display apparatus 1 has a square shape on a plane as shown in FIG. 1, the number of middle display area MDA may be four.

In an embodiment, the middle display area MDA may include the plurality of pixels PX, and a driver and the like configured to provide electric signals or power to each display area DA may be arranged in the middle display area MDA. In some embodiments, the plurality of pixels PX in the middle display area MDA may be disposed above the driver and the like in the middle display area MDA, in an overlapping manner. In some embodiments, a pixel circuit configured to drive the plurality of pixels PX in the middle display area MDA may be arranged in the front display area FDA, the side display area SDA, and/or the corner area CA, which are adjacent to the middle display area MDA.

The display panel 20 shown in FIG. 3 may display images in the side display area SDA and the middle display area MDA, as well as in the front display area FDA. Accordingly, a portion occupied by the display area DA in the display apparatus 1 may increase. That is, in the display apparatus 1 having a same size, a range of the display area PA may decrease and a range of the display area DA may increase.

The plurality of pixels PX are not arranged in the peripheral area PA of the display panel 20, and accordingly, the peripheral area PA may include an area in which images are not provided. The peripheral area PA may include the peripheral area PA outside the display area DA. The peripheral area PA may entirely or partially surround the display area DA. A component, e.g., a driver configured to provide electric signals or power to the display area DA, may be arranged in the peripheral area PA.

The display panel 20 according to the embodiment may include the corner area CA. The corner area CA may be at a corner at which two adjacent edges of the front display area FDA meet each other. In an embodiment, for example, the corner area CA may be at a corner at which the first edge SD1 and the second edge SD2 of the front display area FDA meet each other, and the corner area CA may be adjacent to the first side display area SDA1 and the second side display area SDA2. When the display panel 20 has a square shape on a plane, the number of corner areas CA may be four.

The corner area CA is between the side display areas SDA adjacent to each other and having bent surfaces bent in different directions, and therefore, the corner area CA may include a bent surface in which the bent surfaces bent in various directions are continuously connected. In addition, when the side display areas SDA adjacent to each other have different curvatures, the curvature of the corner area CA may gradually change along the edges of the display apparatus 1. In an embodiment, for example, when the curvature of the first side display area SDA1 and the curvature of the second side display area SDA2 are different from each other, the corner area CA between the first side display area SDA1 and the second side display area SDA2 may have a curvature gradually changing according to positions.

Although the first side display area SDA1 and the second side display area SDA2 and the corner area CA therebetween is described as an example, the example may be similarly applied to other three corner areas CA.

In some embodiments, the corner area CA may include a non-display area in which pixels PX are not arranged. In this case, components, e.g., a driver configured to provide electric signals or power, may be arranged in the corner area CA.

In another embodiment, pixels PX may be arranged in the corner area CA and display images. In this case, a portion occupied by the display area DA in the display panel 20 may further increase. That is, in the display panel 20 having a same size, a range of the non-display area may decrease and a range of the display area DA may increase. In addition, the display panel 20 and the display apparatus 1 including the same may include, at the corner, the corner area CA including bent surfaces rounded at corners and displaying images, and therefore, an aesthetic sense thereof may be improved.

The cover window 30 may be arranged on a front surface of the display panel 20. Here, the 'front surface' of the display panel 20 may be defined as a surface facing a direction in which the display panel 20 provides images.

According to an embodiment, the cover window 30 may be arranged to cover the front surface of the display panel 20. The cover window 30 may protect the front surface of the display panel 20. In addition, the cover window 30 may form an appearance of the display apparatus 1, and accordingly, may include a plane and bent surfaces corresponding to the shape of the display apparatus 1 described above.

The cover window 30 may be attached to the display panel 20 by an adhesive layer (not shown). The adhesive layer may include an adhesive member, e.g., an optical clear adhesive ("OCA") or a pressure sensitive adhesive ("PSA").

The cover window 30 may have a high transmittance to transmit the light emitted from the display panel 20 and a small thickness to minimize a weight of the display apparatus 1. In addition, the cover window 30 may have high intensity and rigidity to protect the display panel 20 from foreign impacts.

In an embodiment, for example, the cover window 30 may include a flexible window. The cover window 30 may protect the display panel 20 by being easily bent due to foreign forces without cracks. As another example, the cover window 30 may include glass, sapphire, or plastic. In an embodiment, for example, the cover window 30 may include ultra-thin glass ("UTGR"), an intensity of which has been improved in a chemical strengthening method or a thermal strengthening method. In another embodiment, the cover window 30 may include ultra-thin glass (UTG®) and colorless polyimide ("CPI"). In an embodiment, the cover window 30 may have a structure in which a flexible polymer layer is disposed on a surface of a glass substrate, or may only include a polymer layer.

As shown in FIG. 4, the cover window 30 may have a flat-surface area FA having a flat surface and a bent-surface area BA having a bent shape. The flat-surface area FA may overlap the front display area FDA of the display panel 20. The bent-surface area BA may overlap the side display area SDA, the corner area CA, and the peripheral area PA of the display panel 20.

The bent-surface area BA may be bent while surrounding at least part of the flat-surface area FA. In an embodiment, the bent-surface area BA may include a first bent-surface area BA1, a second bent-surface area BA2, a third bent-surface area BA3, and a fourth bent-surface area BA4.

The first bent-surface area BA1 and the second bent-surface area BA2 may be bent at a corner CN of the cover window. Here, the corner CN may include a portion in which a long side in the first direction (e.g., the y direction or the −y direction) and a short side in the second direction (e.g., the x direction or the −x direction) of the display apparatus 1 and/or the cover window 30 meet each other.

The first bent-surface area BA1 may overlap the corner area CA of the display panel 20. The first bent-surface area BA1 may be between the third bent-surface areas BA3 adjacent to each other.

The second bent-surface area BA2, which is an area extending from the first bent-surface area BA1, may include an area arranged outside the first bent-surface area BA1. Like the first bent-surface area BA1, the second bent-surface area BA2 may overlap at least part of the corner area CA of the display panel 20. The second bent-surface area BA2 may be between the fourth bent-surface areas BA4 adjacent to each other.

The third bent-surface area BA3 may overlap the side display area SDA of the display panel 20. In an embodiment, for example, the third bent-surface area BA3 may overlap the first side display area SDA1, the second side display area SDA2, the third side display area SDA3, and the fourth side display area SDA4 of the display panel 20. The third bent-surface area BA3 may be bent having a radius of curvature. The third bent-surface area BA3 may include a portion extending in the first direction (e.g., the y direction or the −y direction) and a portion extending in the second direction (e.g., the x direction or the −x direction). That is, the third bent-surface area BA3 may include a portion, which extend in the first direction and overlapping the first side display area SDA1 and the third side display area SDA3, and a portion extending in the second direction and overlapping the second side display area SDA2 and the fourth side display area SDA4. In an embodiment, the first bent-surface area BA1 may be between the portions of the third bent-surface area BA3, and the portions may extend in the first direction and the second direction, respectively.

The fourth bent-surface area BA4 may include an area extending from the third bent-surface area BA3. The fourth bent-surface area BA4 may overlap a peripheral area PA of the display panel 20. The fourth bent-surface area BA4 may include a portion extending in the first direction (e.g., the y direction or the –y direction) and a portion extending in the second direction (e.g., the x direction or the –x direction). In an embodiment, the second bent-surface area BA2 may be between the portions of the fourth bent-surface area BA4, the portions may extend in the first direction and the second direction, respectively.

Referring to FIG. 2, the protective film 10 may be on a back surface of the display panel 20. That is, the protective film 10 may be on another surface of the display panel 20 facing the surface of the display panel 20 in which the cover window 30 is arranged. Here, the protective film 10 may protect the display panel 20 from foreign impacts and absorb impacts from the cover window 30 and the like.

In the embodiment, the protective film 10 may include a first protective film 11 and a second protective film 12 having different physical properties, respectively. The first protective film 11 may overlap the front display area FDA and the side display area SDA of the display panel 20. In addition, the first protective film 11 may overlap a portion of the corner area CA of the display panel 20. The second protective film 12 may overlap at least part of the corner area CA. The first protective film 11 and the second protective film 12 may have different physical properties. Details of the first protective film 11 and the second protective film 12 will be described later.

Figure 5:
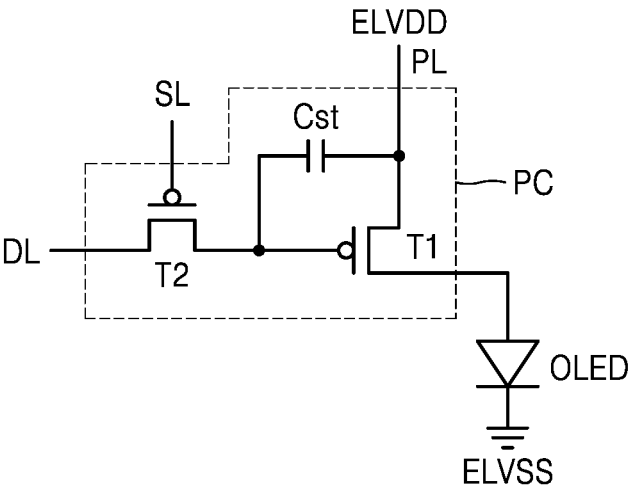
FIG. 5 is an equivalent circuit diagram of any one pixel circuit included in a display panel according to embodiments.

FIG. 5 is an equivalent circuit diagram of any one pixel circuit PC included in the display panel according to embodiments.

Referring to FIG. 5, the pixel circuit PC may include a plurality of thin-film transistors (i.e., a driving thin-film transistor T1 and a switching thin-film transistor T2) and a storage capacitor Cst, and may be electrically connected to an organic light-emitting diode OLED. In an embodiment, the pixel circuit PC may include the driving thin-film transistor T1, the switching thin-film transistor T2, and a storage capacitor Cst.

The switching thin-film transistor T2 may be connected to a scan line SL and a data line DL, and may be configured to deliver a data signal or data voltage from the data line DL to the driving thin-film transistor T1, in response to a scan signal or switching voltage input from the scan line SL. The storage capacitor Cst may be connected to the switching thin-film transistor T2 and a driving voltage line PL, and may be configured to store a voltage corresponding to a difference between the voltage transmitted from the switching thin-film transistor T2 and a first power voltage ELVDD supplied to the driving voltage line PL.

The driving thin-film transistor T1 may be connected to the driving voltage line PL and the storage capacitor Cst, and may be configured to control a driving voltage flowing through the organic light-emitting diode OLED from the driving voltage line PL, in response to a value of the voltage stored in the storage capacitor Cst. A counter electrode (e.g., a cathode) of the organic light-emitting diode OLED may receive a second power voltage ELVSS. The organic light-emitting diode OLED may emit light having a certain luminance in response to the driving current.

Although a case in which the pixel circuit PC includes two thin-film transistors and one storage capacitor is described with reference to FIG. 5, the embodiments are not limited thereto. In an embodiment, for example, the pixel circuit PC may include three or more thin-film transistors and/or two or more storage capacitors. In an embodiment, the pixel circuit PC may include seven thin-film transistors and one storage capacitor. The numbers of the thin-film transistors and storage capacitors may be variously modified according to designs of the pixel circuit PC.

Although the embodiment in which the display apparatus 1 includes the organic light-emitting diode OLED as the light-emitting device has been described above, the display apparatus 1 according to the embodiments is not limited thereto. In another embodiment, the display apparatus 1 may include a light-emitting display including an inorganic light-emitting diode, i.e., an inorganic light-emitting display. In another embodiment, the display apparatus 1 may include a quantum dot light-emitting display. However, for convenience of explanation, the case in which the display apparatus 1 includes the organic light-emitting device OLED will be described hereinafter.

Figure 6:
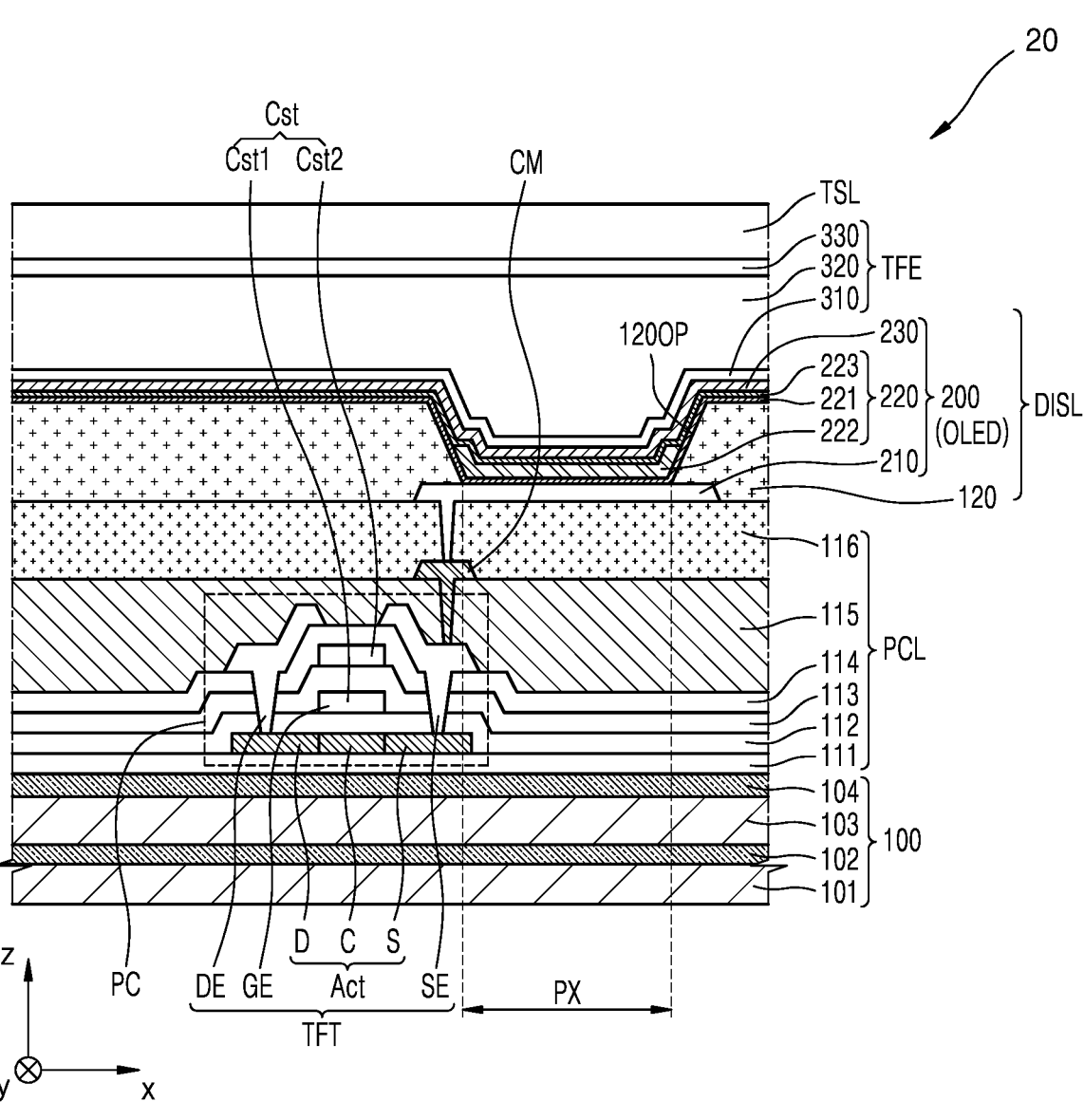
FIG. 6 is a cross-sectional view schematically illustrating a portion of a display panel provided in a display apparatus according to embodiments.

FIG. 6 is a cross-sectional view schematically illustrating a portion of the display panel 20 provided in the display apparatus 1 according to embodiments.

Referring to FIG. 6, the display panel 20 may include a substrate 100, a pixel circuit layer PCL, a display layer DISL, a thin-film encapsulation layer TFE, and a touch sensing layer TSL.

The substrate 100 may have a multiple-layer structure including a base layer and an inorganic layer, wherein the base layer includes a polymer resin. In an embodiment, for example, the substrate 100 may include a base layer, which includes a polymer resin, and a barrier layer including an inorganic insulating layer. In an embodiment, for example, the substrate 100 may include a first base layer 101, a first barrier layer 102, a second base layer 103, and a second barrier layer 104 being sequentially stacked. The first base layer 101 and the second base layer 103 may include polyimide ("PI"), polyethersulfone ("PES"), polyarylate, polyetherimide ("PEI"), polyethylene naphthalate ("PEN"), polyethylene terephthalate ("PET"), polyphenylene sulfide ("PPS"), polycarbonate ("PC"), cellulose triacetate ("TAC"), cellulose acetate propionate ("CAP"), and/or the like. The first barrier layer 102 and the second barrier layer 104 may include an inorganic insulating material, such as silicon oxide, silicon oxynitride, and/or silicon nitride. The substrate 100 may have flexibility.

The pixel circuit layer PCL may be disposed on the substrate 100. The pixel circuit layer PCL may include the pixel circuit PC including a thin-film transistor TFT and the storage capacitor Cst. In addition, the pixel circuit layer PCL may further include a buffer layer 111, a first gate insulating layer 112, a second gate insulating layer 113, an interlayer-insulating layer 114, a first planarization insulating layer 115, and a second planarization insulating layer 116 disposed under or/and on components of the pixel circuit PC.

The buffer layer 111 may reduce or prevent permeation of foreign materials, moisture, or foreign air from under the substrate 100, and may provide a flat surface on the substrate 100. The buffer layer 111 may include an inorganic insulating material, such as silicon oxide, silicon oxynitride, or/and silicon nitride, and may include a single-layer structure or a multiple-layer structure including the aforementioned materials.

The thin-film transistor TFT on the buffer layer 111 may include a semiconductor layer Act, and the semiconductor layer Act may include polysilicon. Alternatively, the semiconductor layer Act may include amorphous silicon, an oxide semiconductor, or an organic semiconductor. The semiconductor layer Act may include a channel area C and a drain area D and a source area S arranged at opposite sides of the channel area C, respectively. The gate electrode GE may overlap the channel area C.

The gate electrode GE may include a low-resistance metal material. The gate electrode GE may include a conductive material including molybdenum (Mo), aluminum (Al), copper (Cu), titanium (Ti), and/or the like, and may include multiple layers or a single layer including the aforementioned materials.

The first gate insulating layer 112 between the semiconductor layer Act and the gate electrode GE may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), or the like. Here, $ZnO_x$ may include zinc oxide (ZnO) and/or zinc peroxide ($ZnO_2$).

The second gate insulating layer 113 may cover the gate electrode GE. Similarly to the first gate insulating layer 112, the second gate insulating layer 113 may include an organic insulating material, such as $SiO_2$, $SiN_x$, SiON, $Al_2O_3$, $TiO_2$, $Ta_2O_5$, $HfO_2$, $ZnO_x$, or the like. Here, $ZnO_x$ may include ZnO and/or $ZnO_2$.

An upper electrode Cst2 of the storage capacitor Cst may be disposed on the second gate insulating layer 113. The upper electrode Cst2 may overlap the gate electrode GE thereunder. Here, the second gate insulating layer 113 and the upper electrode Cst2, which overlap each other with the second gate insulating layer 113 therebetween, may together form the storage capacitor Cst. That is, the gate electrode GE may function as a lower electrode Cst1 of the storage capacitor Cst.

Like this, the storage capacitor Cst and the storage capacitor Cst may overlap each other. In some embodiments, the storage capacitor Cst may not overlap the thin-film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including the aforementioned materials.

The interlayer-insulating layer 114 may cover the upper electrode Cst2. The interlayer-insulating layer 114 may include $SiO_2$, $SiN_x$, SiON, $Al_2O_3$, $TiO_2$, $Ta_2O_5$, $HfO_2$, $ZnO_x$, or the like. Here, $ZnO_x$ may include ZnO and/or $ZnO_2$. The interlayer-insulating layer 114 may include a single layer or multiple layers including the aforementioned inorganic insulating materials.

A drain electrode DE and a source electrode SE may each be on the interlayer-insulating layer 114. The drain electrode DE and the source electrode SE may be connected to the drain area D and the source area S through contact holes under the drain electrode DE and the source electrode SE, respectively. The drain electrode DE and the source electrode SE may include highly conductive materials. The drain electrode DE and the source electrode SE may include a conductive material including Mo, Al, Cu, or/and Ti, and may include multiple layers or a single layer including the aforementioned materials. In an embodiment, the drain electrode DE and the source electrode SE may each include a multiple-layer structure including Ti/Al/Ti.

The first planarization insulating layer 115 may cover the drain electrode DE and the source electrode SE. The first planarization insulating layer 115 may include an organic insulating material, such as a general-purpose polymer like poly(methyl methacrylate) ("PMMA") or polystyrene ("PS"), a polymer derivative having a phenol-based group, an acryl-based polymer, an imide-based polymer, an aryl ether-based polymer, an amide-based polymer, a fluoride-based polymer, a p-xylene-based polymer, a vinyl alcohol-based polymer, or/and a blend thereof.

The second planarization insulating layer 116 may be disposed on the first planarization insulating layer 115. The second planarization insulating layer 116 may include a same material as the material included in the first planarization insulating layer 115, and may include an organic insulating material, such as a general-purpose polymer like PMMA or PS, a polymer derivative having a phenol-based group, an acryl-based polymer, an imide-based polymer, an aryl ether-based polymer, an amide-based polymer, a fluoride-based polymer, a p-xylene-based polymer, a vinyl alcohol-based polymer, or/and a blend thereof.

The display layer DISL may be disposed on the pixel circuit layer PCL having the aforementioned structure. The display layer DISL may include a light-emitting device 200 and a pixel defining film 120. The light-emitting device 200 may include, for example, the organic light-emitting diode OLED, and the organic light-emitting diode OLED may include a stack structure including a pixel electrode 210, an intermediate layer 220, and a counter electrode 230. The organic light-emitting diode OLED may emit, e.g., red, green, or blue light, or may emit red, green, blue, or white light. The organic light-emitting diode OLED may emit light through an emission area, and may define the emission area as the pixel PX.

The pixel electrode 210 may be disposed on the second planarization insulating layer 116. The pixel electrode 210 may contact a contact metal CM, which is disposed on the first planarization insulating layer 115, through contact holes formed in the second planarization insulating layer 116 and the first planarization insulating layer 115, and may be electrically connected to the thin-film transistor TFT through the contact metal CM.

The pixel electrode 210 may include a conductive oxide material, such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another embodiment, the pixel electrode 210 may include a reflective film including Ag, Mg, Al, Pt, Pd, Au, Ni, Nd, Ir, Cr, or combinations thereof. In another embodiment, the pixel electrode 210 may further include a film including ITO, IZO, ZnO, or/and $In_2O_3$ under/above the aforementioned reflective film.

The pixel defining film 120 is disposed on the pixel electrode 210. The pixel defining film 120 define an opening 120OP therein exposing a center portion of the pixel electrode 210. The pixel defining film 120 may include an organic insulating material and/or an inorganic insulating material. The opening 120OP may define an emission area in which light is emitted from the light-emitting device 200. In an embodiment, for example, a size/a width of the opening 120OP may correspond to a size/a width of the emission area. Accordingly, a size and/or a width of the pixel PX may be dependent on the size and/or the width of the opening 120OP of the pixel defining film 120 corresponding to the pixel PX.

The intermediate layer 220 may include an emission layer 222 corresponding to the pixel electrode 210. The emission layer 222 may include a high-molecular or low-molecular organic material emitting light having certain colors. Alternatively, the emission layer 222 may include an inorganic light-emitting material or quantum dots.

A first function layer 221 and a second function layer 223 may be arranged under and on the emission layer 222, respectively. The first function layer 221 may include, for example, a hole transport layer ("HTL"), or may include an HTL and a hole injection layer ("HIL"). The second function layer 223, which is a component disposed above the emission layer 222, may include an electron transport layer ("ETL") and/or an electron injection layer ("EIL"). Like the counter electrode 230 to be described later, the first function layer 221 and/or the second function layer 223 may include a common layer to entirely cover the substrate 100.

The counter electrode 230 may be disposed above the pixel electrode 210 and overlap the pixel electrode 210. The counter electrode 230 may include a conductive material having a small work function. In an embodiment, for example, the counter electrode 230 may include a (semi) transparent layer including Ag, Mg, Al, Pt, Pd, Au, Ni, Nd, Ir, Cr, Li, Ca, or/and alloys thereof. Alternatively, the counter electrode 230 may further include a layer including ITO, IZO, ZnO, or/and $In_2O_3$ and the like on the (semi) transparent layer including the aforementioned materials. The counter electrode 230 may be integrally formed to entirely cover the substrate 100.

The display panel 20 may include a plurality of light-emitting devices 200, which may be configured to provide images by emitting light through the pixels PX. That is, the display area DA (see FIGS. 1A and 1B) may be defined by the plurality of light-emitting devices 200.

The thin-film encapsulation layer TFE may be disposed on the counter electrode 230 of the light-emitting device 200 and cover the light-emitting devices 200 of the display layer DISL. The thin-film encapsulation layer TFE may include at least one inorganic encapsulation layer and at least one organic encapsulation layer, and as an embodiment, FIG. 4 illustrates that the thin-film encapsulation layer TFE includes a first inorganic encapsulation layer 310, an organic encapsulation layer 320, and a second inorganic encapsulation layer 330 being sequentially stacked.

The first inorganic encapsulation layer 310 and the second inorganic encapsulation layer 330 may include one or more inorganic materials among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, or/and polyimide and polyethylene. In an embodiment, the organic encapsulation layer 320 may include acrylate. The organic encapsulation layer 320 may be formed by curing a monomer or coating with polymer. The organic encapsulation layer 320 may be transparent.

The touch sensing layer TSL may be disposed on the thin-film encapsulation layer TFE. In an embodiment, as shown in FIG. 6, the touch sensing layer TSL may be formed directly on the thin-film encapsulation layer TFE, and in this case, an adhesive layer may be not between the touch sensing layer TSL and the thin-film encapsulation layer TFE.

The touch sensing layer TSL may obtain coordination information according to a foreign input, e.g., a touch event. The touch sensing layer TSL may include, for example, a sensing electrode and signal lines connected to the sensing electrode. The touch sensing layer TSL may sense foreign inputs in a mutual cap scheme or a self-cap scheme.

Figure 7:
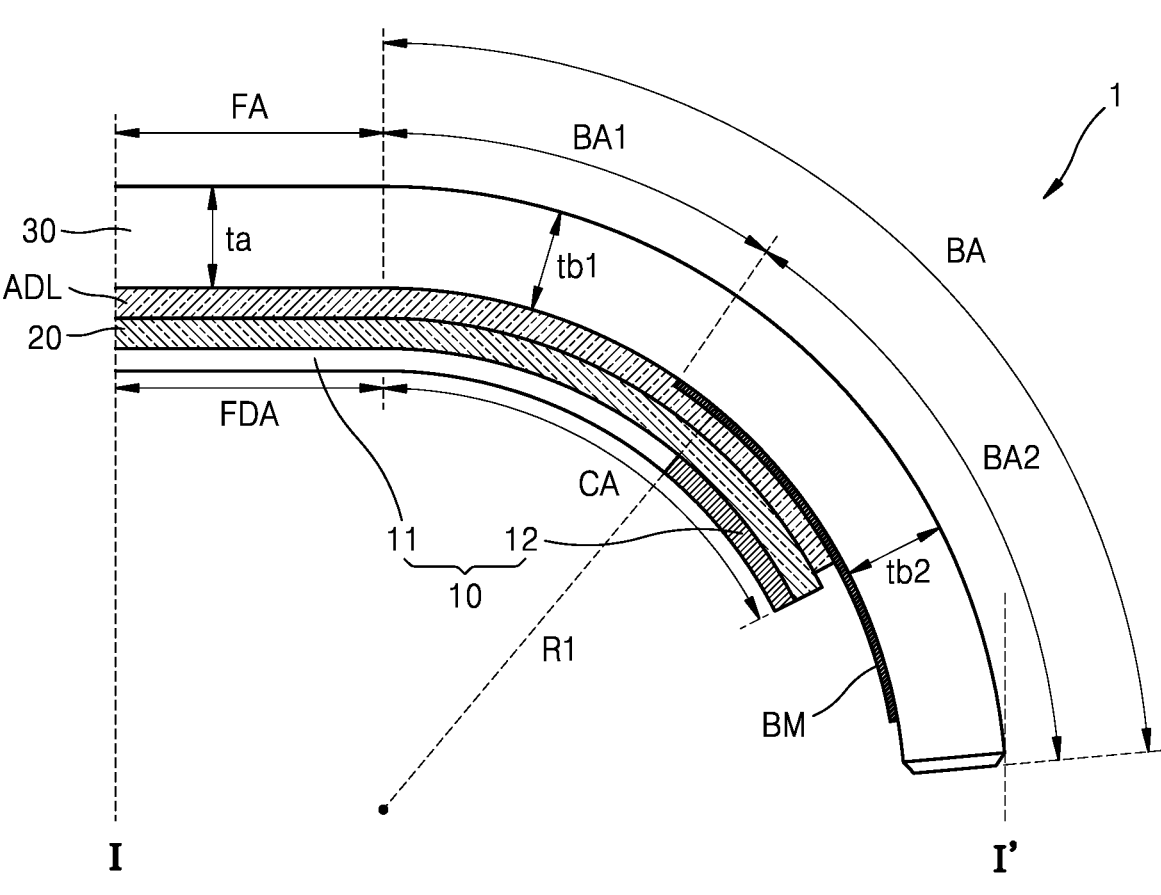
FIG. 7 is a cross-sectional view schematically illustrating a display apparatus according to an embodiment, which is taken along line I-I' shown in FIG. 1.
Figure 8A:
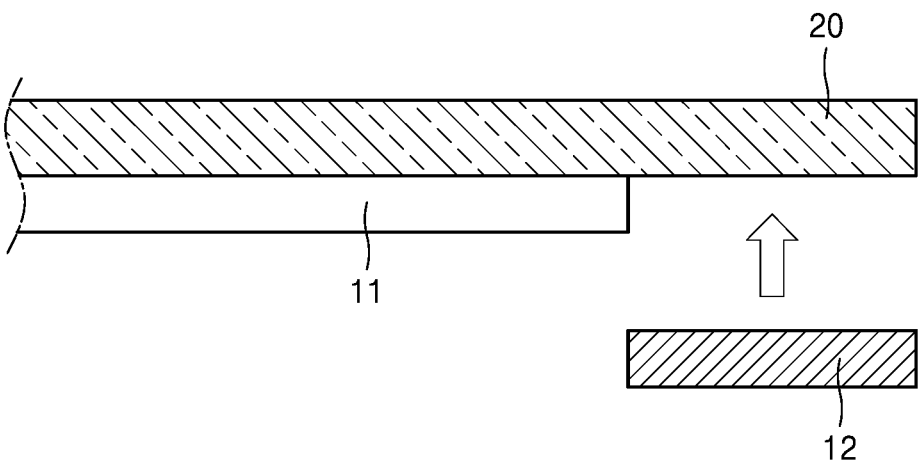
FIGS. 8A and 8B are cross-sectional views schematically illustrating a process in which a protective film is formed on a display panel.
Figure 8B:
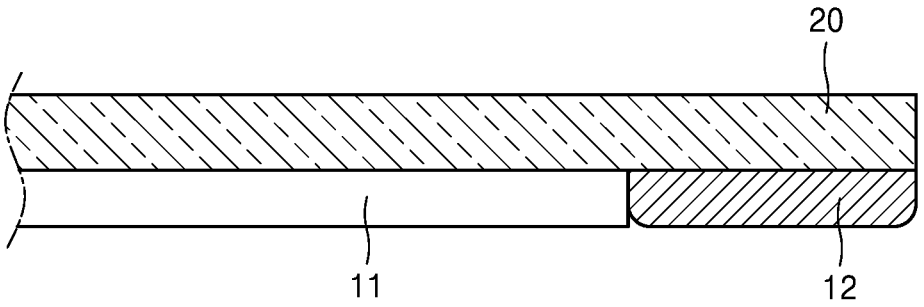

FIG. 7 is a cross-sectional view schematically illustrating the display apparatus 1 according to an embodiment, which is taken along line I-I' shown in FIG. 1. More particularly, FIG. 7 illustrates cross-sections of a portion of a front surface and a corner of the display apparatus 1. FIGS. 8A and 8B are cross-sectional views schematically illustrating a process in which a protective film 10 is formed on the display panel 20.

Referring to FIG. 7, the display apparatus 1 may include the display panel 20, the cover window 30 disposed above the display panel 20, and the protective film 10 disposed under the display panel 20. In the present embodiment, the protective film 10 may include a first protective film 11 and a second protective film 12.

The display panel 20 may be disposed under the cover window 30. The display panel 20 may be attached to the cover window 30 by an adhesive layer ADL. The adhesive layer ADL may include an adhesive member, e.g., an optical clear adhesive ("OCA") or a pressure sensitive adhesive ("PSA").

The cover window 30 may include the flat-surface area FA, the first bent-surface area BA1, and the second bent-surface area BA2. In the cover window 30, a thickness ta of the flat-surface area FA, a thickness tb1 of the first bent-surface area BA1, and a thickness tb2 of the second bent-surface area BA2 may be substantially identical to one another. The first bent-surface area BA1 and the second bent-surface area BA2 of the cover window 30 may be bent with a first curvature radius R1.

The front display area FDA of the display panel 20 may overlap the flat-surface area FA of the cover window 30. The corner area CA of the display panel 20 may overlap the first bent-surface area BA1 and the second bent-surface area BA2 of the cover window 30.

A light-blocking member BM may be disposed under the second bent-surface area BA2 of the cover window 30. The light-blocking member BM, which is for covering a lower structure disposed thereunder, may overlap a peripheral area PA of the display panel 20. The light-blocking member BM may include a light-shielding material. The light-blocking member BM may include a resin carbon black, a carbon nanotube, and/or a black pigment. Alternatively, the light-blocking member BM may include Ni, Al, Mo, and/or alloys thereof. The light-blocking member BM may be coated in an inkjet method or attached as a film type.

The protective film 10 may be disposed under the display panel 20. The protective film 10 may include the first protective film 11 and the second protective film 12. The first protective film 11 may correspond to the front display area FDA and the side display area SDA (see FIG. 3) of the display panel 20. In some embodiments, the first protective film 11 may correspond to a portion of the corner area CA of the display panel 20.

The second protective film 12 may correspond to the corner area CA of the display panel 20. In some embodiment, the second protective film 12 may correspond to an outer area/portion of the corner area CA. The second protective film 12 may overlap at least a portion of the second bent-surface area BA2 of the cover window 30.

The first protective film 11 and the second protective film 12 may have different physical properties. The first protective film 11 is for protecting most of a bottom surface of the display panel 20, and may include a material having a high tensile strength and a low strain rate. The second protective film 12, which is arranged in the corner area CA that is bent, may include a material that may be deformable according to the shape of the corner area CA. A tensile strength of the second protective film 12 may be lower than a tensile strength of the first protective film 11. In addition, a strain rate of the second protective film 12 may be greater than a strain rate of the first protective film 11. A recovery rate of the second protective film 12 may be greater than a recovery rate of the first protective film 11.

In some embodiments, the tensile strength of the first protective film 11 may be about five to ten times the tensile strength of the second protective film 12. In an embodiment, for example, the tensile strength of the first protective film 11 may be about 80 GPa, and the tensile strength of the second protective film 12 may be from about 10 GPa to about 15 GPa.

In some embodiments, Young's Modulus of the first protective film 11 may be from about five hundred times to two thousand times Young's Modulus of the second protective film 12. In an embodiment, for example, the Young's Modulus of the first protective film 11 may be from about 2 GPa to about 4 GPa, and the Young's Modulus of the second protective film 12 may be from about 0.002 GPa to about 0.004 GPa.

In some embodiments, the recovery rate of the second protective film 12 may be from about 94% to about 97%.

The first protective film 11 may include polyethylene terephthalate (PET). The second protective film 12 may include a polymer resin, such as polyurethane, polycarbonate, polypropylene, and polyethylene, or may include an elastic material, such as rubber, a urethane-based material, or sponge obtained by performing foaming plastic process on an acryl-based material.

The first protective film 11 and the second protective film 12 may be formed or disposed on the bottom surface of the display panel 20 before the display panel 20 is attached to the cover window 30. The second protective film 12 may be manufactured in the form of a film and attached to the bottom surface of the display panel 20, or may be formed by coating a liquid resin through an inkjet method and curing the liquid resin.

Referring to FIG. 8A, the first protective film 11 may be first attached to the bottom surface of the display panel 20, and then the second protective film 12 having the film shape may be attached. Alternatively, as shown in FIG. 8B, the second protective film 12 may be formed by attaching the first protective film 11 to the bottom surface of the display panel 20 and then curing the liquid resin through the inkjet method.

Figure 9:
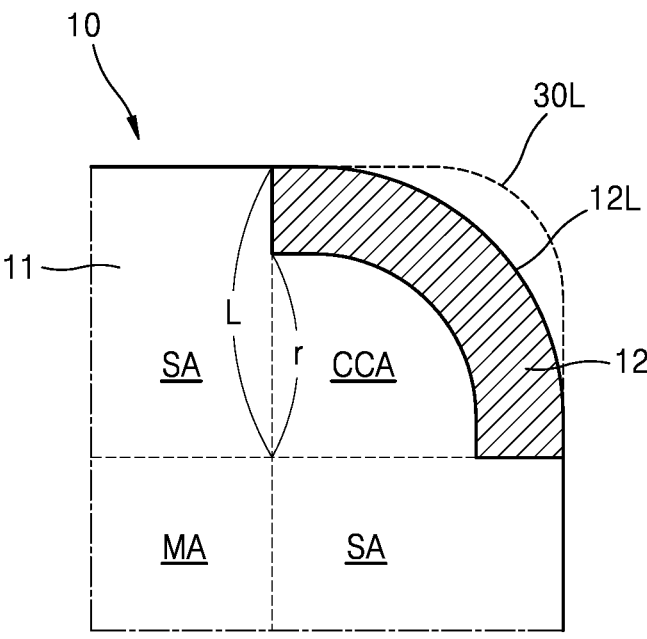
FIG. 9 is a top-plan view illustrating a portion of a protective film that may be included in a display apparatus according to an embodiment.
Figure 10:
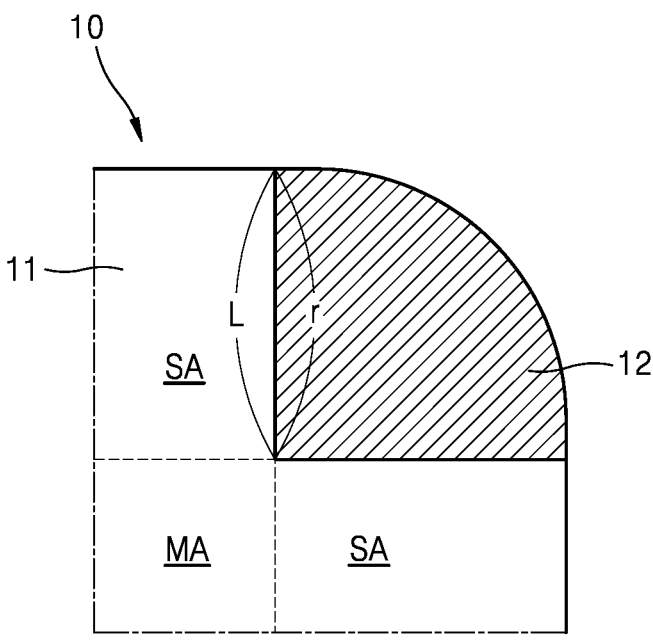
FIG. 10 is a top-plan view illustrating a portion of a protective film that may be included in a display apparatus according to an embodiment.

FIGS. 9 and 10 each are a top-plan view illustrating a portion of the protective film 10 that may be included in the display apparatus 1 according to embodiments.

Referring to FIG. 9, the protective film 10 may include the first protective film 11 and the second protective film 12. The first protective film 11 may include a middle area MA and a side area SA. In addition, the first protective film 11 may include a film-corner area CCA.

The middle area MA of the first protective film 11 may correspond to the front display area FDA of the display panel 20 (see FIG. 3). The side area SA of the first protective film 11 may correspond to the side display area SDA of the display panel 20. The film-corner area CCA of the first protective film 11 may correspond to the middle display area MDA and the corner area CA of the display panel 20. The film-corner area CCA may have the form of a circular sector having a central angle of 90 degrees. In this case, a length r of a radius of the circular sector may be a shorter length than a length L of the side area SA in contact with the circular sector. An area of the film-corner area CCA may be smaller than each of areas of the corner area CA and middle display area MDA of the display panel 20.

The second protective film 12 may correspond to an outer portion of the corner area CA of the display panel 20. Compared with the first protective film 11, the second protective film 12 may have a less tensile strength and a greater strain rate. As the second protective film 12 has a high strain rate, when the corner area CA of the display panel 20 is deformed to have a certain curvature, crimping or buckling may not occur to the second protective film 12. The second protective film 12, which corresponds to the corner area CA of the display panel 20, may eventually receive a compressive stress when attached to the cover window 30 (see FIG. 2). To prevent such situation, in consideration of a curvature of the cover window 30, a length 12L of an outer corner of the second protective film 12 according to the embodiments may be less than a length 30L of an arc of the cover window 30 to which the second protective film 12 is attached.

The protective film 10 may be attached to the bottom surface of the display panel 20, and the display panel 20, to which the protective film 10 has been attached, may be attached to the cover window 30 according to the shape of the cover window 30.

In this case, the second protective film 12 attached to the bottom surface of the display panel 20 may be stretched when being attached to the cover window 30 and may be deformed to fit the curvature of the cover window 30, and then may be released from the compressive stress.

Although FIG. 9 illustrates that the second protective film 12 is arranged to correspond to the outer area of the corner area CA of the display panel 20, the embodiments are not limited thereto. In another embodiment, as shown in FIG. 10, the first protective film 11 may only include the middle area MA corresponding to the front display area FDA of the display panel 20 and the side area SA corresponding to the side display area SDA of the display panel 20 without the film-corner area CCA, and the second protective film 12 may be arranged to correspond to the entire portion of the corner area CA of the display panel 20. In some embodiments, the second protective film 12 may be provided in the form of a circular sector. In this case, the length r of the radius of the circular sector of the second protective film 12 may be identical to a length L of a side of the side area SA of the first protective film 11. FIG. 10 illustrates that the second protective film 12 has the form of a circular sector having the central angle of 90 degrees, but the embodiments are not limited thereto. In some embodiment, the second protective film 12 may be provided in the form of a circular sector having a central angle from about 60 degrees to about 180 degrees.

Figure 11:
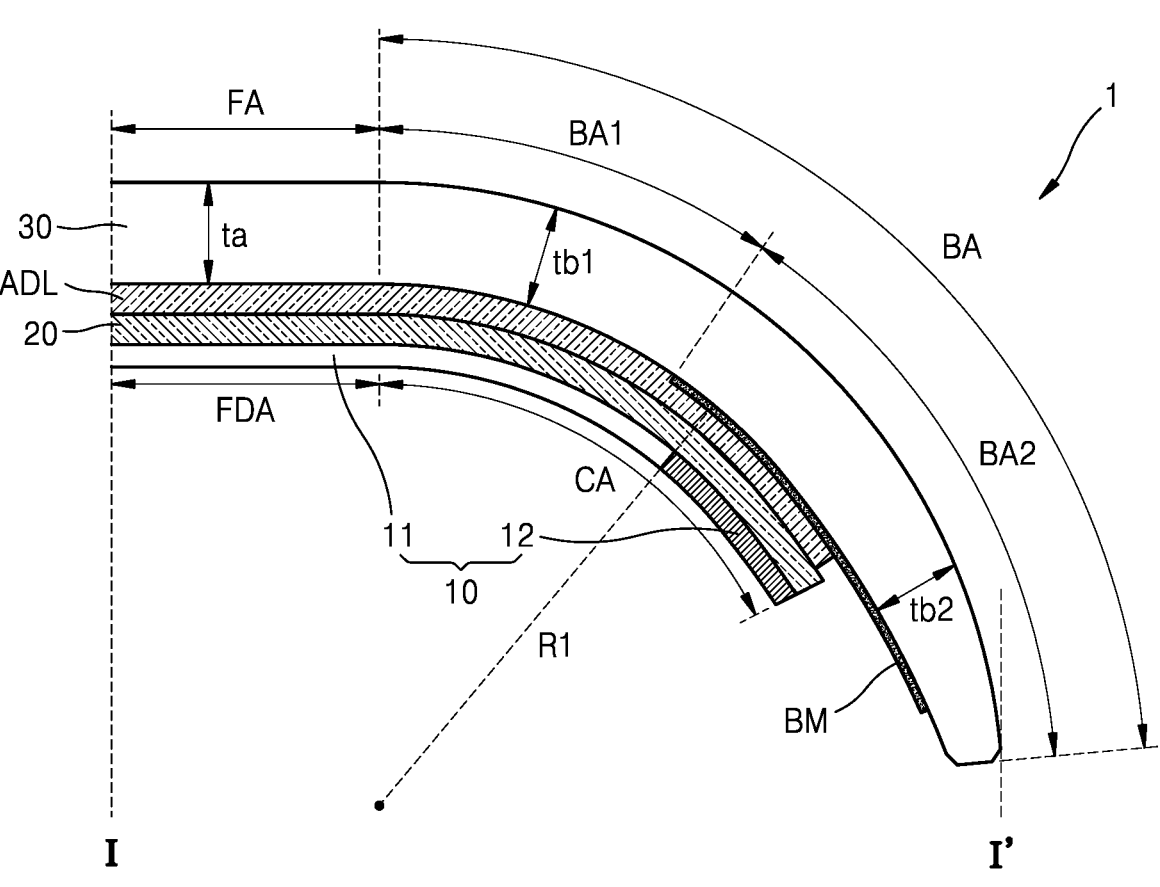
FIG. 11 is a cross-sectional view schematically illustrating a display apparatus according to another embodiment.

FIG. 11 is a cross-sectional view schematically illustrating the display apparatus 1 according to another embodiment. More particularly, FIG. 11 illustrates cross-sections of a portion of the front surface and a corner of the display apparatus 1. In FIG. 11, same reference numerals as those of FIG. 7 indicate same components, and therefore, descriptions thereof will not be repeatedly given.

Referring to FIG. 11, the display apparatus 1 may include the display panel 20, the cover window 30 disposed above the display panel 20, and the protective film 10 disposed under the display panel 20.

The cover window 30 may include the flat-surface area FA and the bent-surface area BA that is bent at the corner of the flat-surface area FA. The bent-surface area BA may include the first bent-surface area BA1 and the second bent-surface area BA2. The first bent-surface area BA1 is adjacent to the flat-surface area FA, and the second bent-surface area BA2 is adjacent to an edge of the cover window 30. The light-blocking member BM may be on the bottom surface of the second bent-surface area BA2, and cover at least a portion of the second bent-surface area BA2.

In the present embodiment, the thickness ta of the flat-surface area FA of the cover window 30 and the thickness tb1 of the first bent-surface area BA1 may be substantially identical to each other. The second bent-surface area BA2 may be provided in a tapered shape. That is, the thickness tb2 at an edge of the second bent-surface area BA2 may be less than the thickness tb2 at a center portion of the second bent-surface area BA2, and the thickness tb2 at a center portion of the second bent-surface area BA2 may be less than the thickness tb2 at the border between the first bent-surface area BA1 and the second bent-surface area BA2. In an embodiment, for example, the thickness tb2 of the second bent-surface area BA2 may decrease toward the edge of the second bent-surface area BA2. In an embodiment, the thickness tb2 at the edge of the second bent-surface area BA2 may be in a range from about 60% to about 90% of the first thickness tb1 of the first bent-surface area BA1. As the second bent-surface area BA2 is provided in a tapered shape, the compressive stress, which occurs when the second bent-surface area BA2 is bent, may be small. Accordingly, crimping or buckling that may occur to the second bent area BA2 or thereunder may be not found or effectively reduced.

The front display area FDA of the display panel 20 may overlap the flat-surface area FA of the cover window 30. The corner area CA of the display panel 20 may overlap the first bent-surface area BA1 and the second bent-surface area BA2 of the cover window 30.

The protective film 10 may be disposed under the display panel 20. The protective film 10 may include the first protective film 11 and the second protective film 12. The first protective film 11 may correspond to the front display area FDA and the side display area SDA (see FIG. 3) of the display panel 20. In some embodiments, the first protective film 11 may correspond to a portion of the corner area CA of the display panel 20.

The second protective film 12 may correspond to the corner area CA of the display panel 20. The second protective film 12 may correspond to the outer area of the corner area CA. The second protective film 12 may overlap the second bent-surface area BA2 of the cover window 30.

The first protective film 11 and the second protective film 12 may have different physical properties. The first protective film 11 is for protecting most of a bottom surface of the display panel 20, and may include a material having a high tensile strength and a low strain rate. The second protective film 12, which is arranged in the corner area CA that is bent, may include a material that may be deformable according to the shape of the corner area CA. A tensile strength of the second protective film 12 may be lower than a tensile strength of the first protective film 11. In addition, a strain rate of the second protective film 12 may be greater than a strain rate of the first protective film 11. A recovery rate of the second protective film 12 may be greater than a recovery rate of the first protective film 11.

In some embodiments, the tensile strength of the first protective film 11 may be about five to ten times the tensile strength of the second protective film 12. In an embodiment, for example, the tensile strength of the first protective film 11 may be about 80 GPa, and the tensile strength of the second protective film 12 may be from about 10 GPa to about 15 GPa.

In some embodiments, Young's Modulus of the first protective film 11 may be from about five hundred times to two thousand times Young's Modulus of the second protective film 12. In an embodiment, for example, the Young's Modulus of the first protective film 11 may be from about 2 GPa to about 4 GPa, and the Young's Modulus of the second protective film 12 may be from about 0.002 GPa to about 0.004 GPa.

In some embodiments, the recovery rate of the second protective film 12 may be from about 94% to about 97%.

The display apparatus according to the embodiments includes the first protective film and the second protective film having different tensile strengths, respectively, and therefore, the reliability of the corner area of the display panel may be effectively improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus defining an x axis, a y axis, and a z axis perpendicular to each other, the display apparatus comprising:

a cover window comprising a flat-surface area and a bent-surface area bent from at least a portion of a boundary of the flat-surface area;

a display panel arranged on a surface of the cover window and comprising a front display area overlapping the flat-surface area, first and second side areas positioned adjacent to the front display area and respectively extending along the x axis and the y axis and overlapping the bent-surface area, and a corner area positioned at an intersection of the first and second side areas overlapping the bent-surface area; and a protective layer, wherein the bent-surface area comprises a first bent-surface area and a second bent-surface area arranged outside the first bent-surface area, wherein the cover window is arranged continuously in order with the flat-surface area, the first bent-surface area, and the second bent-surface area, wherein the protective layer comprises:

a first protective film, which is arranged on a surface of the display panel and overlaps the front display area and the first and second side areas along the z axis; and a second protective film overlapping at least part of the corner area, wherein both the flat-surface area the first bent-surface area cover the first protective film, and the second bent-surface area covers an entirety of the second protective film, wherein the z axis extends along a thickness direction of the display apparatus, wherein an edge of the first protective film abuts an edge of the second protective film, and wherein a tensile strength of the second protective film is less than a tensile strength of the first protective film.

2. The display apparatus of claim 1, wherein the tensile strength of the second protective film is from about 10 gigapascals (GPa) to about 15 GPa.

3. The display apparatus of claim 1, wherein Young's Modulus of the first protective film is five hundred times to two thousand times Young's Modulus of the second protective film.

4. The display apparatus of claim 1, wherein a recovery rate of the second protective film is from about 94% to about 97%.

5. The display apparatus of claim 1, wherein a light-blocking member is further arranged under the cover window, the second bent-surface area covering an entirety of the light-blocking member.

6. The display apparatus of claim 5, wherein the second protective film is arranged to correspond to the second bent-surface area.

7. The display apparatus of claim 5, wherein a thickness of the first bent-surface area is identical to a thickness of the flat-surface area, and a thickness of the second bent-surface area decreases toward an edge of the second bent-surface area.

8. The display apparatus of claim 1, wherein a length of an outer edge of the second protective film before attachment to the cover window is less than a length of an arc of the cover window at which the second protective film is attached.

9. The display apparatus of claim 1, wherein the first protective film comprises a film-corner area corresponding to the corner area of the display panel, and a flat surface of the film-corner area has a circular-sector shape.

10. The display apparatus of claim 1, wherein a flat surface of the second protective film has a circular-sector shape.

11. An electronic device comprising the display apparatus of claim 1.

12. A display apparatus comprising:

a cover window including a flat-surface area and a bent-surface area bent at a corner of the flat-surface area, the bent-surface area comprising a first bent-surface area and a second bent-surface area;

a light-blocking member arranged under the second bent-surface area and not disposed under the first bent-surface area;

a display panel arranged on a surface of the cover window and comprising a front display area and a corner area overlapping the flat-surface area and the bent-surface area, respectively;

a first protective film, which is arranged on a surface of the display panel and overlaps the front display area; and a second protective film overlapping at least part of the corner area, wherein the cover window is arranged continuously in order with the flat-surface area, the first bent-surface area, and the second bent-surface area, wherein both the flat-surface area the first bent-surface area cover the first protective film, and the second bent-surface area covers an entirety of the second protective film, and wherein the first protective film and the second protective film have different physical properties from each other.

13. The display apparatus of claim 12, wherein a tensile strength of the second protective film is less than a tensile strength of the first protective film, and the tensile strength of the second protective film is from about 10 GPa to about 15 GPa.

14. The display apparatus of claim 12, wherein Young's Modulus of the first protective film is five hundred times to two thousand times Young's Modulus of the second protective film.

15. The display apparatus of claim 12, wherein a recovery rate of the second protective film is from about 94% to about 97%.

16. The display apparatus of claim 12, wherein the second protective film overlaps the light-blocking member.

17. The display apparatus of claim 12, wherein a length of an outer edge of the second protective film before attachment to the cover window is less than a length of an arc of the cover window at which the second protective film is attached.

18. The display apparatus of claim 12, wherein the first protective film comprises a film-corner area corresponding to the corner area of the display panel, and a flat surface of the film-corner area has a circular-sector shape.

19. The display apparatus of claim 12, wherein a flat surface of the second protective film has a circular-sector shape.

20. The display apparatus of claim 12, wherein a display element is arranged in the display panel to correspond to the first bent-surface area.

21. The display apparatus of claim 12, wherein an adhesive layer is further disposed between the cover window and the display panel.

22. An electronic device comprising the display apparatus of claim 12.

* * * * *